(12) United States Patent
Bergamaschi et al.

(10) Patent No.: US 7,676,779 B2
(45) Date of Patent: Mar. 9, 2010

(54) LOGIC BLOCK TIMING ESTIMATION USING CONESIZE

(75) Inventors: Reinaldo A. Bergamaschi, Tarrytown, NY (US); Sean M. Carey, Hyde Park, NY (US); Brian W. Curran, Saugerties, NY (US); Prabhakar N. Kudva, New York, NY (US); Matthew E. Mariani, York Haven, PA (US); Mark D. Mayo, Wappingers Falls, NY (US); Ruchir Puri, Baldwin Place, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 11/853,235

(22) Filed: Sep. 11, 2007

(65) Prior Publication Data

US 2009/0070719 A1    Mar. 12, 2009

(51) Int. Cl.
G06F 17/50    (2006.01)
G06F 9/45    (2006.01)

(52) U.S. Cl. .................. 716/6; 716/5; 716/18; 703/13; 703/14

(58) Field of Classification Search ................. 716/5–6, 716/18; 703/13–14
See application file for complete search history.

(56) References Cited

U.S. PATENT DOCUMENTS

| | | | |
|---|---|---|---|
| 5,475,605 A | 12/1995 | Lin | 716/6 |
| 5,544,071 A | 8/1996 | Keren et al. | 364/489 |
| 5,553,000 A | 9/1996 | Dey et al. | 364/488 |
| 5,619,418 A | 4/1997 | Blaauw et al. | 716/6 |
| 6,543,037 B1 | 4/2003 | Limqueco et al. | 716/6 |
| 6,622,291 B1 * | 9/2003 | Ginetti | 716/9 |
| 6,643,832 B1 | 11/2003 | Ray et al. | 716/6 |
| 6,904,573 B1 | 6/2005 | Burden et al. | 716/2 |
| 7,194,394 B2 * | 3/2007 | Dorfman et al. | 703/3 |
| 7,203,919 B2 | 4/2007 | Suaris et al. | 716/6 |
| 2002/0023252 A1 | 2/2002 | Lee et al. | 716/6 |
| 2003/0140324 A1 | 7/2003 | Yalcin et al. | 716/6 |
| 2005/0132316 A1 | 6/2005 | Suaris et al. | 716/11 |
| 2008/0276209 A1 | 11/2008 | Albrecht et al. | 716/6 |

* cited by examiner

*Primary Examiner*—Thuan Do
*Assistant Examiner*—Nghia M Doan
(74) *Attorney, Agent, or Firm*—William A. Kinnaman, Jr.; Lynn L. Augspurger

(57) ABSTRACT

A system for logic block timing analysis may include a controller, and storage in communication with the controller. The storage may provide delay-versus-conesize values of a logic block. The system may further include a fitting module to provide a delay-cone based upon the delay-versus-conesize values of the logic block. The system may also include a conesize parser that uses the delay-cone to provide delay values through the logic block. The conesize parser may be used to validate the design of the logic block by comparing the delay-cone with a desired cycle time.

16 Claims, 4 Drawing Sheets

CONEDELAY=A*LOG_B(CONESIZE)+C

LOGIC BLOCK TIMING ESTIMATION USING CONESIZE

RELATED APPLICATION

This application contains subject matter related to a co-pending application Ser. No. 11/853,276 entitled "System to Identify Timing Differences from Logic Block Changes and Associated Methods", the entire subject matter of which is incorporated herein by reference in its entirety. The aforementioned application is assigned to the same assignee as this application, International Business Machines Corporation of Armonk, N.Y.

FIELD OF THE INVENTION

The invention relates generally to the field of custom processor design, and particularly to the areas of frequency and static timing analysis.

BACKGROUND OF THE INVENTION

It is generally understood that as transistor device size continues to decrease, device speeds in processors have continued to increase. When coupled with shorter clocking speeds (a.k.a. higher frequency), this has allowed processors to run at faster and faster speeds.

With the assumption of higher device speeds, the traditional processor design approach has been focused on defining the logical architecture, or pipeline, and the physical partitioning of the processor, with little up-front consideration of the ability to meet frequency requirements. However, as current process technologies, e.g. 65 nm and 45 nm, are beginning to reach theoretical limits of both device and interconnect speed, frequency analysis, or timing analysis, it is now a requirement of the high-level design stage to verify a given pipeline design will function within the given cycle time constraints.

In order to perform this analysis, a designer should convert a logical block, or "cone," into a quantifiable unit of time, or "delay", that can be summed and measured against the target cycle time. The actual delay of a given cone is a function of the number of inputs, or "conesize", the critical delay path, and the speed of the physical processor components, all of which are subject to random change based on state of the inputs and process variation. As a result, a simple conversion function does not exist.

Because this type of analysis was previously not required, few or no solutions have been invented. One attempt at such a solution has been mental estimation of the logic delay, based on designer knowledge of logic structure and estimated gate delays. The drawback of this solution is that results require large human investment of time and may not be systematically regenerated.

Mental estimation of the logic delay is therefore usually impractical given design cycle time constraints, and stale estimations typically result in inaccurate analysis. As such, there is a need for a system and/or method of logical delay analysis that can be used to validate a pipeline architecture against a given cycle time and technology in the design phase.

SUMMARY OF THE INVENTION

In view of the foregoing background, it is therefore an object of the invention to provide a system for logical delay analysis during the design phase that may be used to validate a pipeline architecture against a given cycle time and technology.

This and other objects, features, and advantages in accordance with the invention are provided by a system for logic block timing analysis. The system may include a microprocessor, processor, controller, or the like.

The system may also include storage in communication with the controller. The storage may provide delay-versus-conesize values of a logic block. The system may further include a fitting module to provide a delay-cone based upon the delay-versus-conesize values of the logic block.

The system may also comprise a conesize parser that uses the delay-cone to provide delay values through the logic block. The conesize parser may be used to validate the design of the logic block by comparing the delay-cone with a desired cycle time. Accordingly, the system provides logic block timing analysis.

The conesize parser may generate a logic synthesis file. The storage may provide the conesize as a function of inputs of the logic block. The storage may also provide the delay-versus-conesize values using logic block parameters comprising speed of the logic block components, critical path delay, state of the inputs, and process variation.

The fitting module may provide the delay-cone using a best-fit curve. The fitting module may also provide the best-fit curve based upon empirical data from other logic blocks. The fitting module may permit the delay-cone to be scaled proportionally to feature sizes of alternate logic blocks.

Another aspect of the invention is a method for logic block timing analysis. The method may include storing delay-versus-conesize values of a logic block, and providing a delay-cone based upon the delay-versus-conesize values of the logic block.

The method may also include using the delay-cone to provide delay values of the logic block, and validating design of the logic block by comparing the delay-cone with a desired cycle time. The method may further include generating a logic synthesis file based upon the delay-cone, and scaling the delay-cone proportionally to feature sizes of alternate logic blocks.

DETAILED DESCRIPTION OF THE PREFERRED EMBODIMENTS

Figure 1:
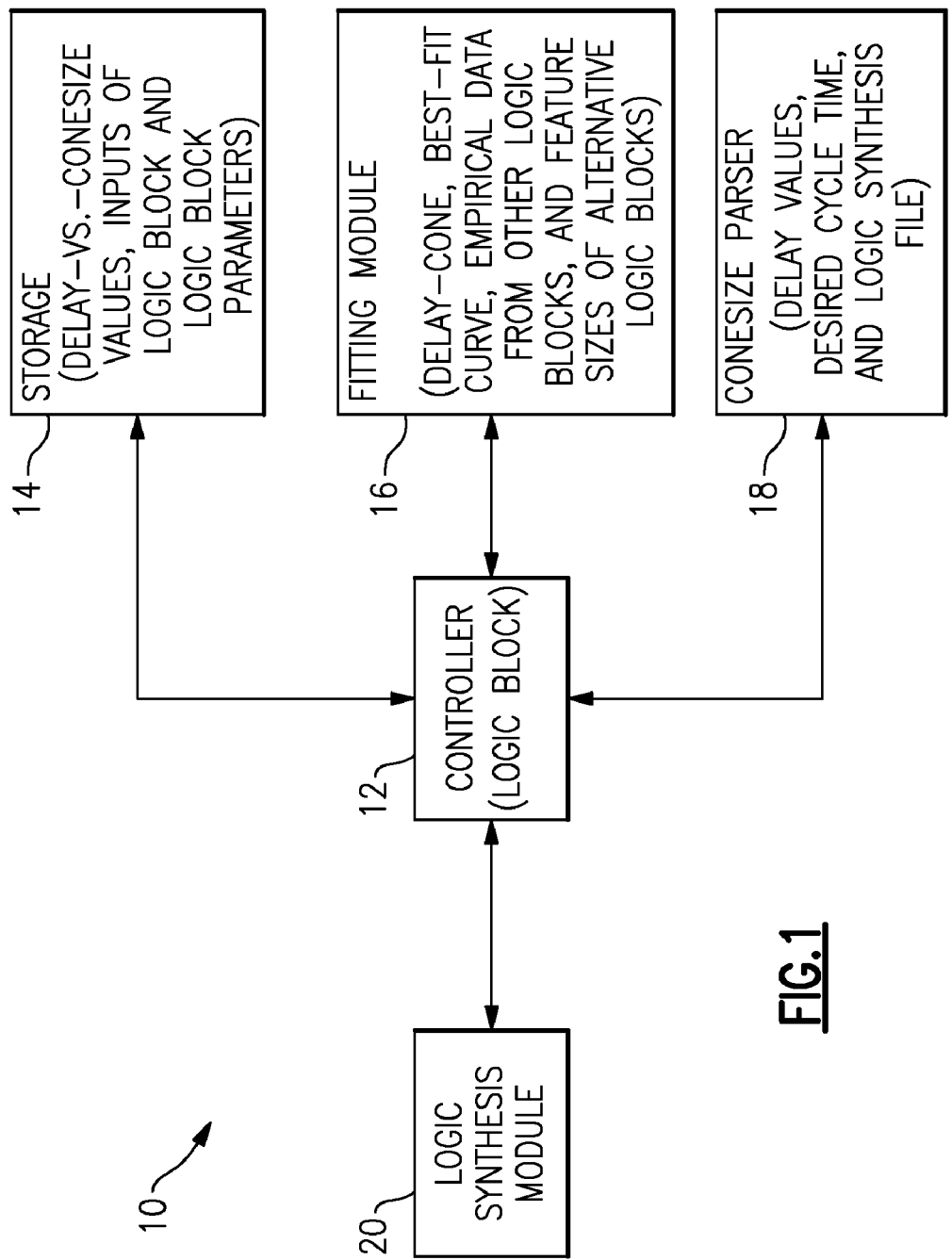
FIG. 1 is a block diagram illustrating a system for logic block timing analysis in accordance with the invention.

The invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

As will be appreciated by one skilled in the art, the invention may be embodied as a method, system, or computer program product. Furthermore, the invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, or semiconductor system. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device.

Computer program code for carrying out operations of the invention may be written in an object oriented programming language such as Java, Smalltalk, C++ or the like. However, the computer program code for carrying out operations of the invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Figure 2:
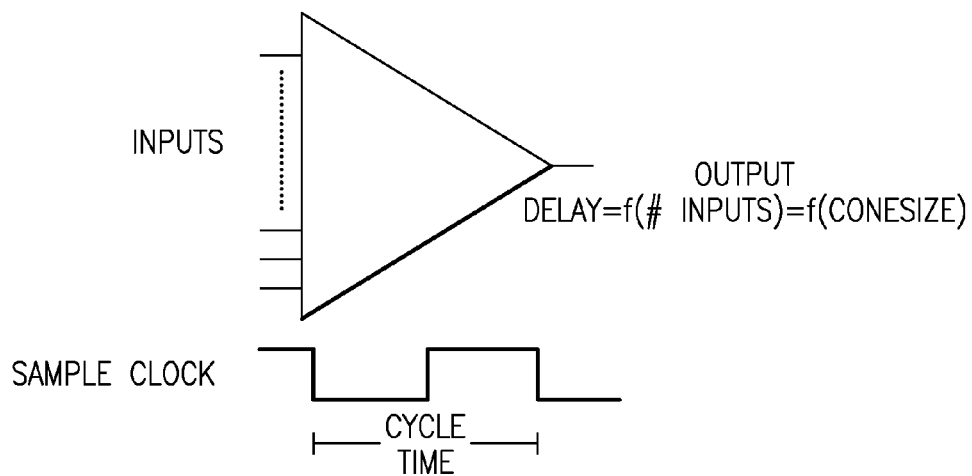
FIG. 2 is a block diagram illustrating an abstract circuit showing propagation of logical inputs across a generic circuit, or cone of logic, during a generic system cycle in accordance with the invention.

Referring initially to FIGS. 1 and 2, a system 10 for logic block timing analysis is initially described. The system 10 can be implemented in software, firmware, hardware or any combination thereof. The system includes a controller 12, such as a microprocessor, processor, or other logic circuitry. The controller 12 is in communication with storage 14 as will be appreciated by those of skill in the art. In other embodiments, the storage 14 may be embedded in the processor 12.

In one embodiment, the storage 14 provides delay-versus-conesize values of a logic block. In another embodiment, the system further includes a fitting module 16 to provide a delay-cone based upon the delay-versus-conesize values of the logic block.

In yet another embodiment, the system also comprises a conesize parser 18 that uses the delay-cone to provide delay values through the logic block. The conesize parser 18 may be used to validate the design of the logic block by comparing the delay-cone with a desired cycle time. In another embodiment, the conesize parser 18 generates a logic synthesis file, which may be used by a logic synthesis module 20 using modeling languages such as VHDL, Verilog, or the like.

The storage 14 provides the conesize as a function of inputs of the logic block, for instance. The storage 14 also provide the delay-versus-conesize values using logic block parameters comprising speed of the logic block components, critical path delay, state of the inputs, and process variation, for example.

In one embodiment, the fitting module 16 provides the delay-cone using a best-fit curve. In another embodiment, the fitting module 16 provides the best-fit curve based upon empirical data from other logic blocks. In yet another embodiment, the fitting module 16 permits the delay-cone to be scaled proportionally to feature sizes of alternate logic blocks. Accordingly, the system 10 provides logic block timing analysis.

For example, while the delay-cone of a logic block often cannot be exactly calculated, empirical delay results based on existing hardware designs can be used as a predictive means of delay analysis. By measuring the actual delays of logic cones with varying size on existing hardware, it is possible to plot delay as a function of cone size (i.e. number of logic inputs). The resulting plot can be used to produce a best-fit curve for estimating delay within a given process technology. This empirical approach has several advantages.

First, this approach is friendly towards automation, as existing software tools can be used to calculate conesize for a given logic block using an input VHDL file and results can be fed into the delay estimation function. Next, the ability to estimate delay using a function of one input, cone size, allows logic designers to quickly analyze structures for proper timing partitioning across a pipeline. This is highly beneficial during the high level design phase as logic design changes are constantly occurring. Finally, conesize-based timing estimation curves for a given process technology can be utilized in future projects by scaling the delay curve by amounts proportional to the feature sizes in the process technology.

As a result, the system 10 can perform static timing and delay analysis using empirical delay data from existing microprocessor hardware. This data may be used to extract a best-fit curve that estimates delay as a function of VHDL conesize. Because this method for delay estimation is not dependent on computationally intensive circuit and critical path analysis, it provides a useful building-block for microprocessor timing analysis during the high-level design phase.

In other words, the purpose of timing analysis during high-level design should be to validate logic partitioning against a given cycle time. For example, FIG. 2 illustrates the delay of a set of logic (cone) within a given stage of a pipeline which should be less than the cycle time. As such, this approach uses the number of inputs of the logical cone as an indicator of the signal delay of the cone, for example.

Figure 3:
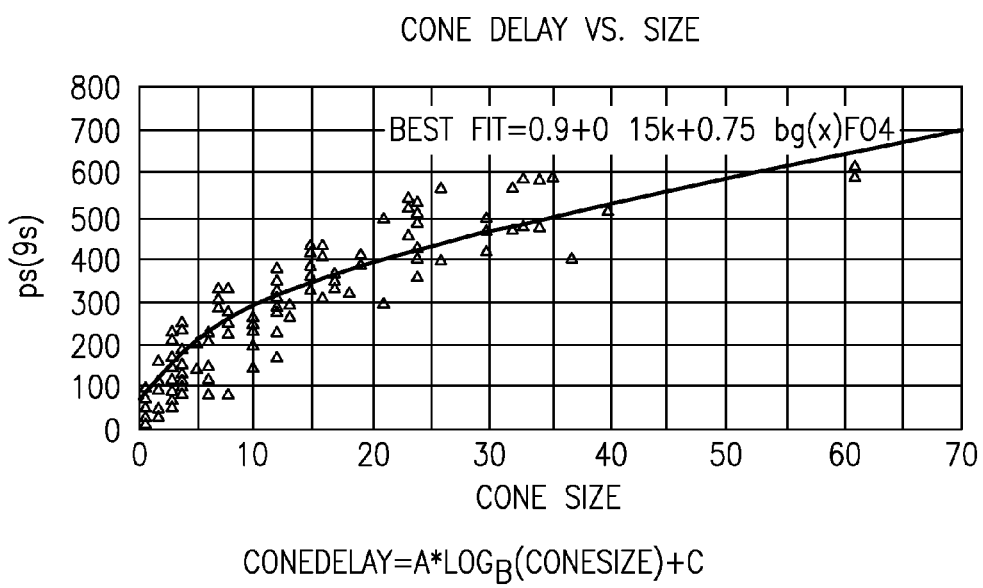
FIG. 3 is a block diagram illustrating an example plot of multiple circuit delay samples as a function of VHSIC Hardware Description Language ("VHDL") conesizes, used to provide a best-fit curve for delay approximation in accordance with the invention.

The equation for relating delay versus conesize is obtained by empirically sampling circuit delays in real, physical hardware, plotting the results as a function of cone size, and extrapolating a best-fit curve. Sample results, such as those shown in FIG. 3, suggest that this curve may be a logarithmic relationship.

$$ConeDelay = A * \log_B(ConeSize) + C$$

The best-fit curve and key constants (A,B,C) of this equation can be calculated using standard spreadsheet tools. Once these constants have been derived, the resultant equation can be applied.

Figure 4:
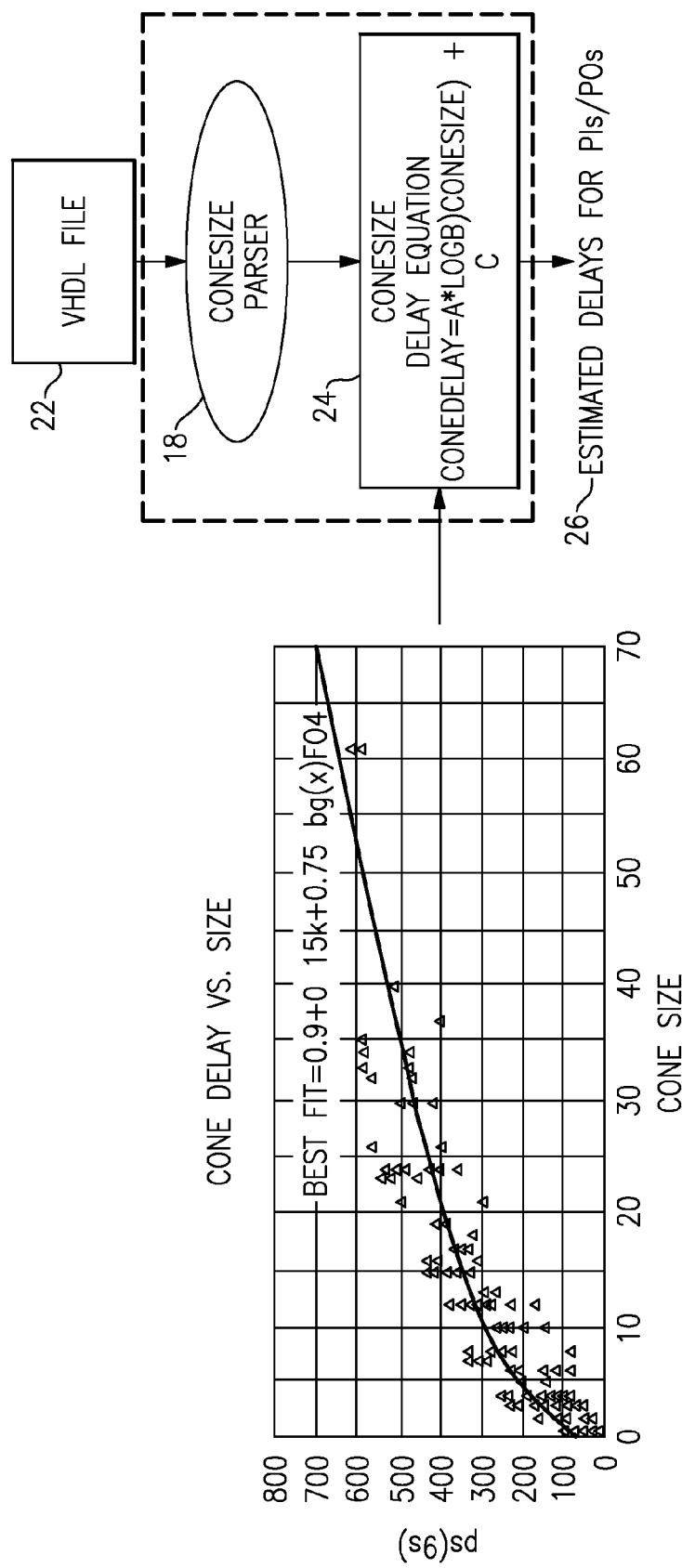
FIG. 4 illustrates a theoretical timing estimation process that could be used as an application of the empirically derived delay equation in accordance with the invention.

An application can next be used to apply the delay estimation equation. Referring additionally to FIG. 4, this application uses a VHDL file 22 as input, for example. For all output signals of the VHDL logic block, cone sizes (the number of inputs of a logical cone) can be computed using the VHDL conesize parser 18. These conesizes may then be applied against the cone delay estimation equation 24 yielding delay values 26 for each output of the logic block.

The logic design can be validated by comparing the resultant delays against the target cycle time. If the estimated delay is found to be larger than the target cycle time, the designer may choose to restructure the VHDL design to better balance logic across the pipeline in order to meet cycle time/frequency objectives. This may also indicate where the designer may need to restructure VHDL in order to allow the possibility of additional logic that may enter the design later in the implementation stage of design.

Figure 5:
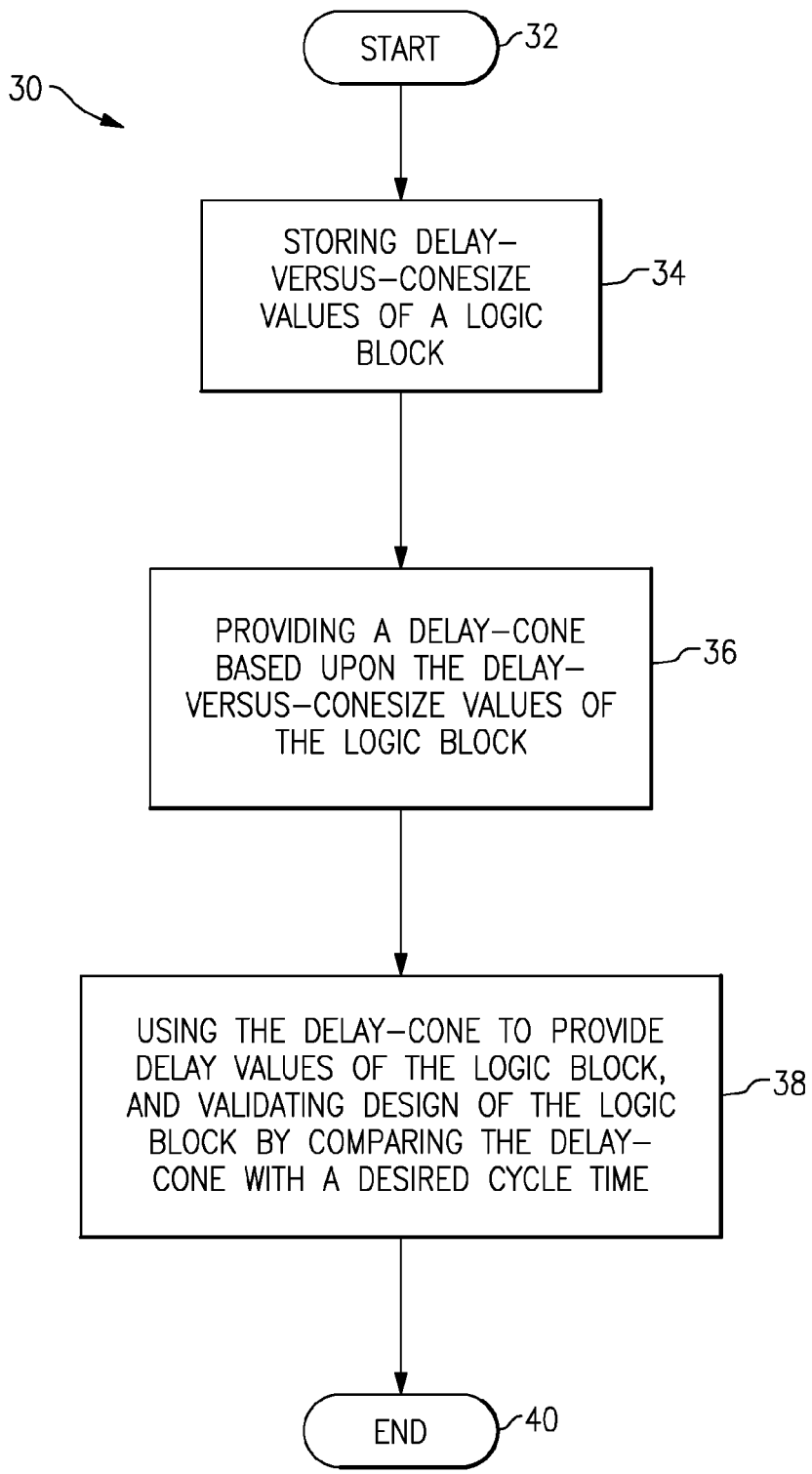
FIG. 5 is a flowchart illustrating a method for logic block timing analysis in accordance with the invention.

Another aspect of the invention is directed to a method for logic block timing analysis, which is now described with reference to flowchart 30 of FIG. 5. The method begins at Block 32 and may include storing delay-versus-conesize values of a logic block at Block 34. The method may also include providing a delay-cone based upon the delay-versus-conesize values of the logic block at Block 36. The method may further include using the delay-cone to provide delay values of the logic block, and validating design of the logic block by comparing the delay-cone with a desired cycle time at Block 38. The method ends at Block 40.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that other modifications and embodiments are intended to be included within the scope of the appended claims.

That which is claimed is:

1. A system for logic block timing analysis, the system comprising:
   a controller;
   storage in communication with said controller, said storage providing delay-versus-conesize values of a logic block; and
   a fitting module to determine logic block timing via a delay-cone that is based upon the delay-versus-conesize values of the logic block;
   wherein said storage provides the delay-versus-conesize values using logic block parameters comprising speed of the logic block components, critical path delay, state of the inputs, and process variation; and
   wherein said fitting module provides a best-fit curve based upon empirical data from the logic block to validate the logic block design.

2. The system of claim 1 further comprising a conesize parser that uses the delay-cone to provide delay values through the logic block.

3. The system of claim 2 wherein said conesize parser can be used to validate design of the logic block by comparing the delay-cone with a desired cycle time.

4. The system of claim 2 wherein said conesize parser generates a logic synthesis file.

5. The system of claim 1 wherein said storage provides the conesize as a function of inputs of the logic block.

6. The system of claim 1 wherein said fitting module provides the delay-cone using the best-fit curve.

7. The system of claim 1 wherein said fitting module permits the delay-cone to be scaled proportionally to feature sizes of alternate logic blocks.

8. A method for logic block timing analysis, the method comprising:
   storing delay-versus-conesize values of a logic block;
   determining with a fitting module logic block timing via a delay-cone that is based upon the delay-versus-conesize values of the logic block
   providing the delay-versus-conesize values using logic block parameters comprising speed of the logic block components, critical path delay, state of the inputs, and process variation; and
   generating the delay-cone using a best-fit curve based upon empirical data from the logic block to validate the logic block design.

9. The method of claim 8 further comprising using the delay-cone to provide delay values of the logic block.

10. The method of claim 8 further comprising validating design of the logic block by comparing the delay-cone with a desired cycle time.

11. The method of claim 8 further comprising generating a logic synthesis file based upon the delay-cone.

12. The method of claim 8 further comprising scaling the delay-cone proportionally to feature sizes of alternate logic blocks.

13. A computer program product executable by a computer system embodied in a computer readable storage device comprising:
   computer readable program codes coupled to the tangible media for logic block timing analysis, the computer readable program codes configured to cause the program to:
   store delay-versus-conesize values of a logic block;
   determining with a fitting module logic block timing via a delay-cone that is based upon the delay-versus-conesize values of the logic block
   provide the delay-versus-conesize values using logic block parameters comprising speed of the logic block components, critical path delay, state of the inputs, and process variation; and
   generate the delay-cone using a best-fit curve based upon empirical data from the logic block to validate the logic block design.

14. The computer program product of claim 13 further comprising program code configured to: use the delay-cone to provide delay values of the logic block.

15. The computer program product of claim 13 further comprising program code configured to: validate design of the logic block by comparing the delay-cone with a desired cycle time.

16. The computer program product of claim 13 further comprising program code configured to: generate a logic synthesis file based upon the delay-cone.

* * * * *